United States Patent [19]
Lavan

[11] Patent Number: 5,357,624
[45] Date of Patent: Oct. 18, 1994

[54] SINGLE INLINE MEMORY MODULE SUPPORT SYSTEM

[75] Inventor: Thomas J. Lavan, El Toro, Calif.

[73] Assignee: AST Research, Inc., Irvine, Calif.

[21] Appl. No.: 220,940

[22] Filed: Mar. 31, 1994

Related U.S. Application Data

[63] Continuation of Ser. No. 781,405, Oct. 23, 1991, abandoned.

[51] Int. Cl.⁵ .............................................. G06F 12/00
[52] U.S. Cl. ............................. 395/425; 364/DIG. 1; 364/232.7; 364/245; 364/248; 365/63
[58] Field of Search .................. 395/425; 364/DIG. 1; 365/52, 63

[56] References Cited

U.S. PATENT DOCUMENTS

| | | | |
|---|---|---|---|
| 4,545,010 | 10/1985 | Salas et al. | 395/425 |
| 4,787,060 | 11/1988 | Boudreau et al. | 395/425 |
| 5,036,481 | 7/1991 | Lunsford et al. | 361/686 |
| 5,253,357 | 10/1993 | Allen et al. | 395/425 |
| 5,272,664 | 12/1993 | Alexander et al. | 365/52 |

*Primary Examiner*—Rebecca L. Rudolph
*Assistant Examiner*—Sheela N. Nadig
*Attorney, Agent, or Firm*—Knobbe, Martens, Olson & Bear

[57] ABSTRACT

A Single Inline Memory Module (SIMM) support system enables a computer system to recognize and address 1-Mbyte, 4-Mbyte and 16-Mbyte SIMMs installed in a receiving socket having only a number of pins sufficient to address the 1-Mbyte and 4-Mbyte SIMMs. The capacity of the SIMM is determined by a TYPE signal on a predetermined pin of the installed SIMM which is connected to a pull-up resistor of the SIMM support circuitry and generates a TYPE signal. If the TYPE signal is a logic low, the installed SIMM has a 1-Mbyte capacity. If the TYPE signal is a logic high, the installed SIMM has a 4-Mbyte or a 16-Mbyte capacity. In order to remain pin compatible with 1-Mbyte and 4-Mbyte SIMMs, a 16-Mbyte SIMM cannot have any additional pins to address the additional memory locations. Thus, the TYPE signal shares a pin with the most significant address bit required to address the 16-Mbyte SIMM. The sharing is controlled so that the most significant address bit is only active when the TYPE signal is in its inactive high state.

11 Claims, 6 Drawing Sheets

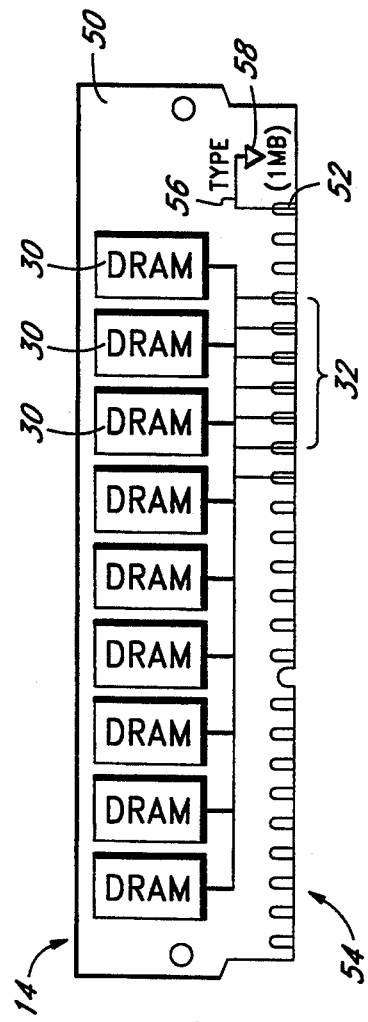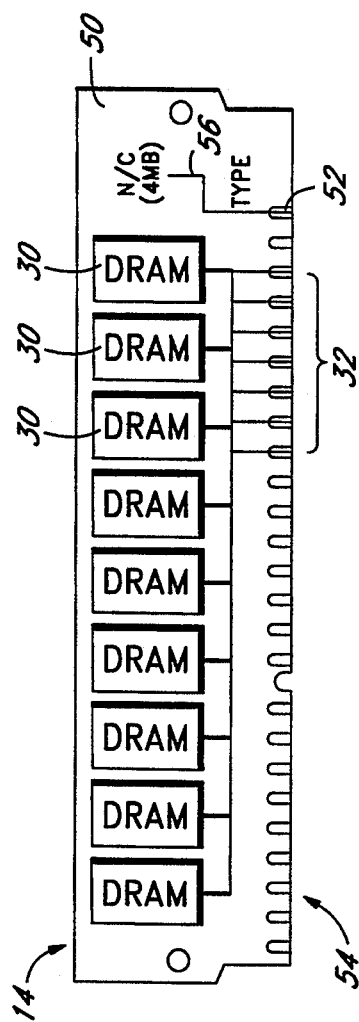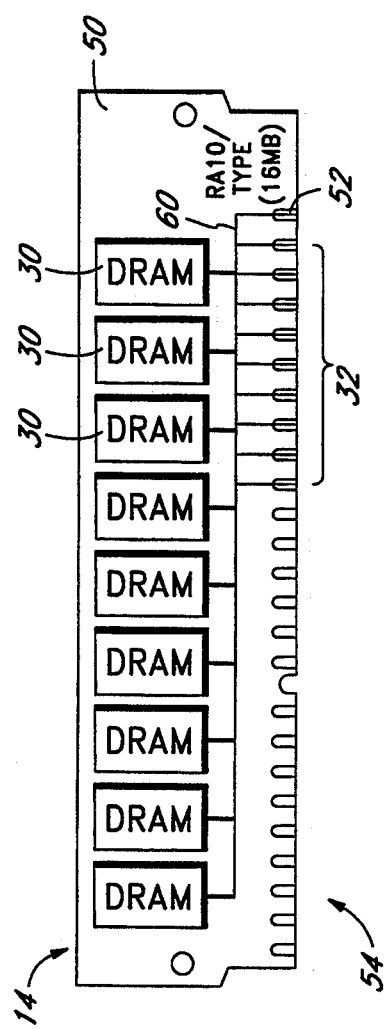

SINGLE INLINE MEMORY MODULE SUPPORT SYSTEM

This application is a continuation of application Ser. No. 07/781,405, filed Oct. 23, 1991, now abandoned.

BACKGROUND OF THE INVENTION

1. Field of the Invention

The present invention is related to the expansion of the capacity of a Single Inline Memory Module (SIMM). Specifically, the present invention is a method that allows the expansion of the Memory Module and its addressing system without adding additional address and type pins to the existing SIMMs.

2. Description of the Related Art

In modern computer technology, advanced computer software and operating system functions necessitate additional memory space. The main memory space in a personal computer (PC) comprises multiple Dynamic Random Access Memory (DRAM) chips which in the past were physically socketed on the motherboard of the PC. A typical PC requires a minimum of 15-30 DRAMs in order to operate at its most basic level. In order to run more complex applications additional memory capacity is required, therefore additional DRAM chips must be installed.

It can be very time consuming to add or replace large numbers of DRAM chips, as each individual chip must be installed by hand. In addition, it is possible to orient the chips wrong during installation. Improper orientation could result in bending the chip leads, poor connection of the chip leads to the socket, or installing the chips backwards, all of which may render the DRAM chip intermittently or permanently inoperable. If one of the DRAM chips is inoperable, a portion of the computer system's memory will no longer be addressable. If a DRAM chip becomes inoperable during normal operation after installation, not only will the chip be unaddressable, but all the information stored on that chip will be lost. Thus, to decrease the possibility of improper memory installation during memory expansion, a more easily installable memory unit is required.

The DRAM chips occupy a large percentage of the motherboard and therefore limit the space available for circuitry. Space must be reserved on the motherboard to enable memory future expansion, and this limits the space available for adding other functions. As space is one of the most important elements of motherboard design, the required memory spacing weighs heavily on the overall system design. As the computer industry is constantly pushing for smaller and smaller computer systems, the development of a less space consuming memory system was necessitated.

The computer industry has mitigated the memory spacing problems to some degree, by creating the Single Inline Memory Module (SIMM) concept. A SIMM is a small circuit board with a predetermined group of DRAM chips soldered into the board. The SIMM circuit board can be easily installed in a specialized socket on the motherboard. The circuit board simply snaps into the socket without the need for specialized tools or procedures, and has only one allowable orientation in the socket. The circuit boards are installed in the sockets at an approximately perpendicular orientation to the motherboard, and therefore do not use as much space as the previous horizontal orientation of the individual DRAM chips. The SIMM concept has helped minimize the space and installation problems of the individually installable DRAM systems.

The industry has developed several different standard sizes of sockets, printed circuit cards and memory densities for the SIMMs. The one limiting factor of the SIMM design is the interconnection between the printed circuit cards and the motherboard through the sockets. In order to upgrade the memory capacity of an individual SIMM, not only are new address lines required, but new systems for indicating the capacity of the SIMMs to the motherboard must be implemented. As every upgrade necessitates more lines of communication between the SIMM and the motherboard, additional pins must be available on the printed circuit board and accompanying socket of the SIMM. Once all the pins on the printed circuit boards have been utilized, an entirely new board and accompanying mating socket must be designed to enable memory capacity upgrades. This is very costly to implement and would render all the older SIMM printed circuit boards and sockets inoperable, as they could not properly communicate with the each new SIMM support system.

Accordingly, memory system upgrades are limited by the inadequacies of the existing SIMM technology.

SUMMARY OF THE INVENTION

The present invention provides for a means of upgrading the memory capacity of a SIMM that has already allocated all of its pins for communication with the motherboard. More specifically, the present invention utilizes one of the existing pins of the SIMM on a shared basis to provide the additional communication lines between the SIMM and the motherboard.

Each SIMM has an existing pin, the Type pin, that is used to alert the system of the memory capacity of the SIMM. In the prior art, if the type pin is tied to ground on the SIMM, then the SIMM support circuitry of the computer system detects that the SIMM comprises 1 Megabyte (Mbyte) of addressable DRAM chips. If the type pin is floating and is pulled up high by an external pull-up resistor connected to 5 volts on the motherboard, then the SIMM is detected to have 4-Mbytes of DRAM chips. The present invention is a specialized SIMM support system that enables the computer to recognize and address a 16-Mbyte SIMM. In addition, the new SIMM support system can still recognize and address the older 1-Mbyte and 4-Mbyte SIMMs.

The SIMM support system of the present invention enables the computer to recognize and address different capacity SIMMs installed in a specifically sized receiving socket. The SIMM support system comprises a means for sharing a specific pin of the SIMM and a corresponding pin of the receiving socket for transmitting both a capacity signal conveying the capacity of an installed SIMM and an uppermost address line used to address the largest capacity SIMM that can be installed in the receiving socket. In addition, the SIMM support circuitry includes a means for buffering the receipt of the capacity of the installed SIMM across a shared pin of the SIMM and a means for storing the capacity of the installed SIMM upon receiving a reset signal from the computer system. The SIMM support circuitry also includes a means for buffering the transmission of the uppermost address line from the computer system across the shared pin to the appropriate DRAM chips on the SIMM. The buffer is used to prevent damage to the buffering device and to reduce power consumption of the driving circuitry. Finally, the support system includes additional means for determining the capacity of the installed SIMM by writing a specific pattern to the SIMM and reading the pattern back until the pattern repeats itself thus determining the storage capacity of the SIMM.

BRIEF DESCRIPTION OF THE DRAWINGS

FIG. 4a is a partial schematic illustration of the preferred embodiment of a 1-Mbyte SIMM card that operates in communication with the present invention.

FIG. 4b is a partial schematic illustration of the preferred embodiment of a 4-Mbyte SIMM card that operates in communication with the present invention.

FIG. 4c is a partial schematic illustration of the preferred embodiment of a 16-Mbyte SIMM card that operates in communication with the present invention.

DETAILED DESCRIPTION OF THE PREFERRED EMBODIMENT

Figure 1:
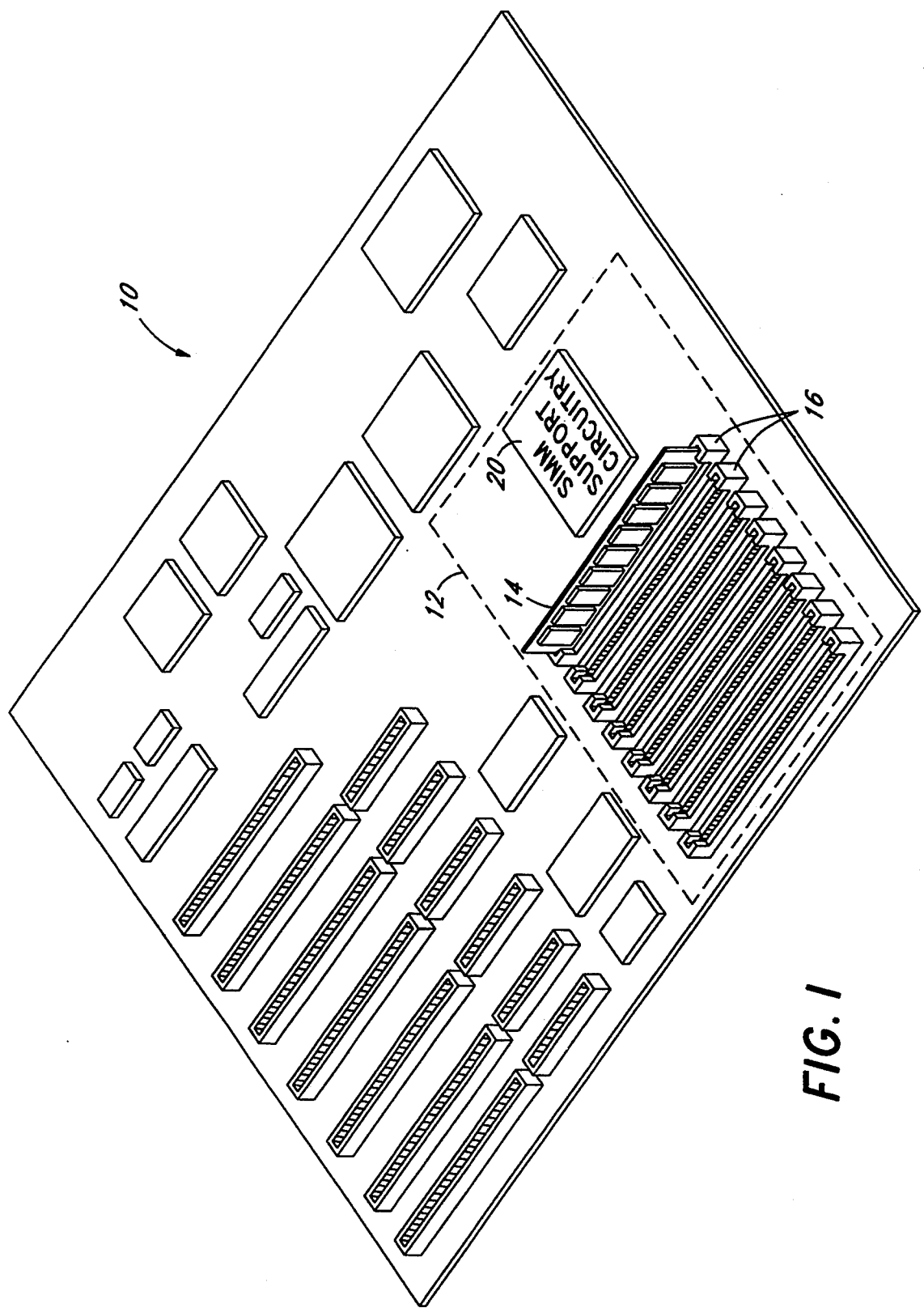
FIG. 1 is a perspective view of a typical PC motherboard layout which includes a plurality of SIMM installation sockets.

FIG. 1 illustrates a typical PC motherboard 10 which includes an area 12 reserved for a SIMM support system. The SIMM support system includes an area reserved for the installation of a plurality of SIMMs 14 in a corresponding plurality of SIMM receiving sockets 16. A SIMM support circuit 20 is located proximate to the sockets 16. As illustrated, the SIMM support circuit 20 preferably comprises an application specific integrated circuit (ASIC) formed in a single integrated circuit package. The SIMM support circuit 20 may be implemented in a plurality of logic circuits. The SIMM support circuitry 20 is used to determine the capacity of the installed SIMM 14 as well as to address the memory provided by each SIMM 14.

Figure 2:
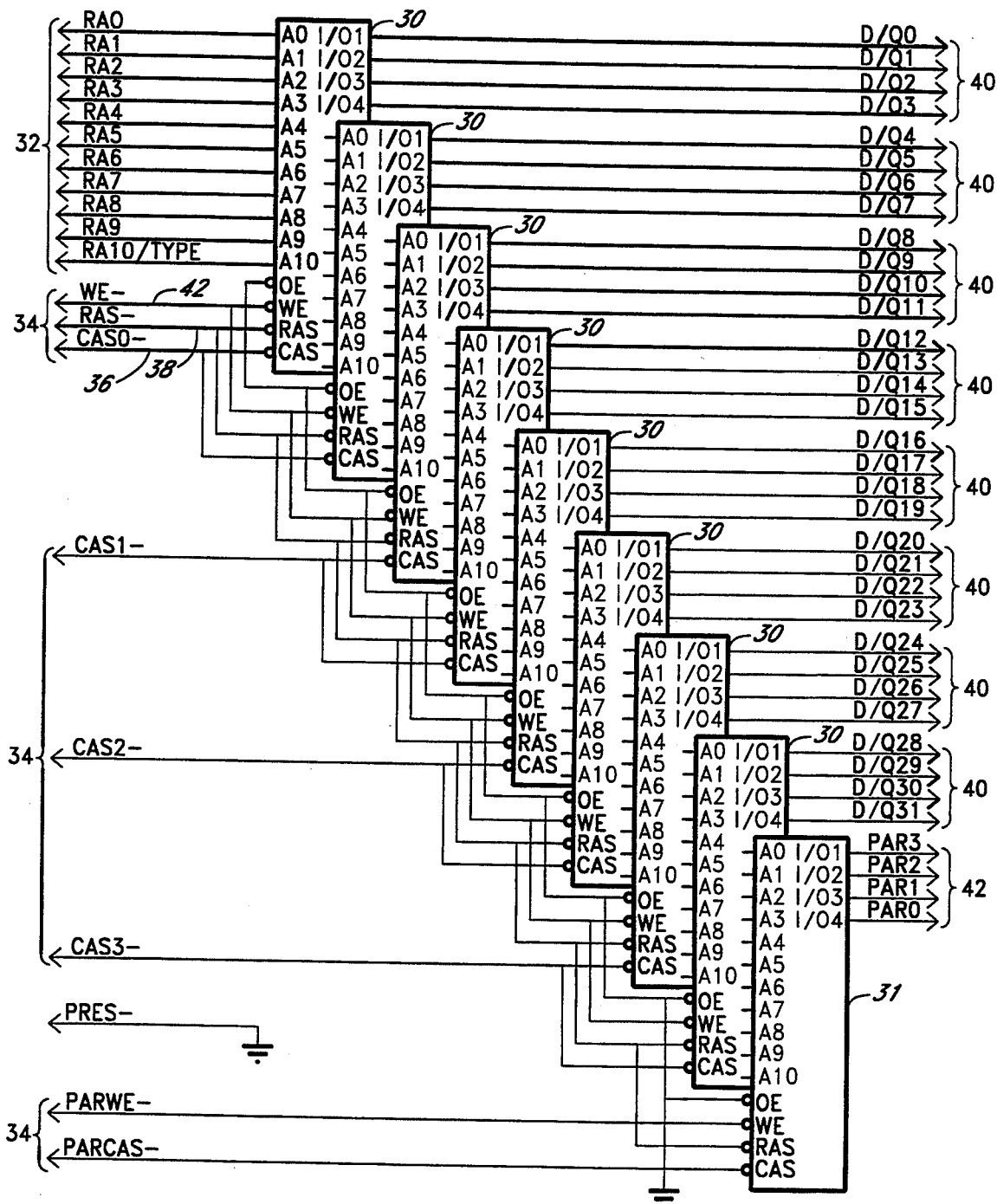
FIG. 2 is a partial schematic of an exemplary 16-Mbyte SIMM memory circuit for a 32-bit computer system.

FIG. 2 illustrates a schematic example of a typical SIMM memory accessing scheme for a 32-bit computer system. As illustrated in FIG. 2, the additional memory provided by the SIMM 14 comprises a plurality of DRAM chips 30 which are addressed via a plurality of address lines 32 and various DRAM Control lines 34. Each DRAM chip 30 is a storage cell which is organized in an array. In order to locate a specific storage location of the array, the appropriate row and column addresses must be provided. By storing data in an array, the number of required addressing lines 32 is reduced, as the same address line 32 can be used to provide both the row and column address of the data. By adding one new address line 32, the data capacity is increased four times, as each address line 32 provides two new row and two new column addresses. The CAS signal line 36 activates the addressing of the appropriate column of the storage cell while the RAS signal line 38 activates the addressing of the appropriate row. After the appropriate storage location is addressed, each DRAM chip 30 has a plurality of input/output (I/O) lines 40 which are used to transmit and receive data between the motherboard 10 and the DRAM chips 30. The exemplary circuit of FIG. 2 illustrates a system which has eight DRAM chips 30 used for storage each with four I/O lines 40 thus providing for transmission of 32 bits of data. If less than 32 bits of information are required, then only the required number of chips are accessed. The only other selection line to the DRAM chips that comes from the motherboard 10 is the WE line 42 which enables the data on the I/O lines 40 to be written to the DRAM. Also illustrated in FIG. 2, is a parity DRAM 31 which is a conventional DRAM chip 30 used to store parity information for the data stored in the remaining DRAMs 30 on the SIMM 14. The parity information is a coded representation of the data that is stored in the remaining DRAM chips 30. A parity DRAM 31 has its own separate control lines 34 as it is accessed at different times than the conventional data that is stored on the SIMM 14.

Figure 3:
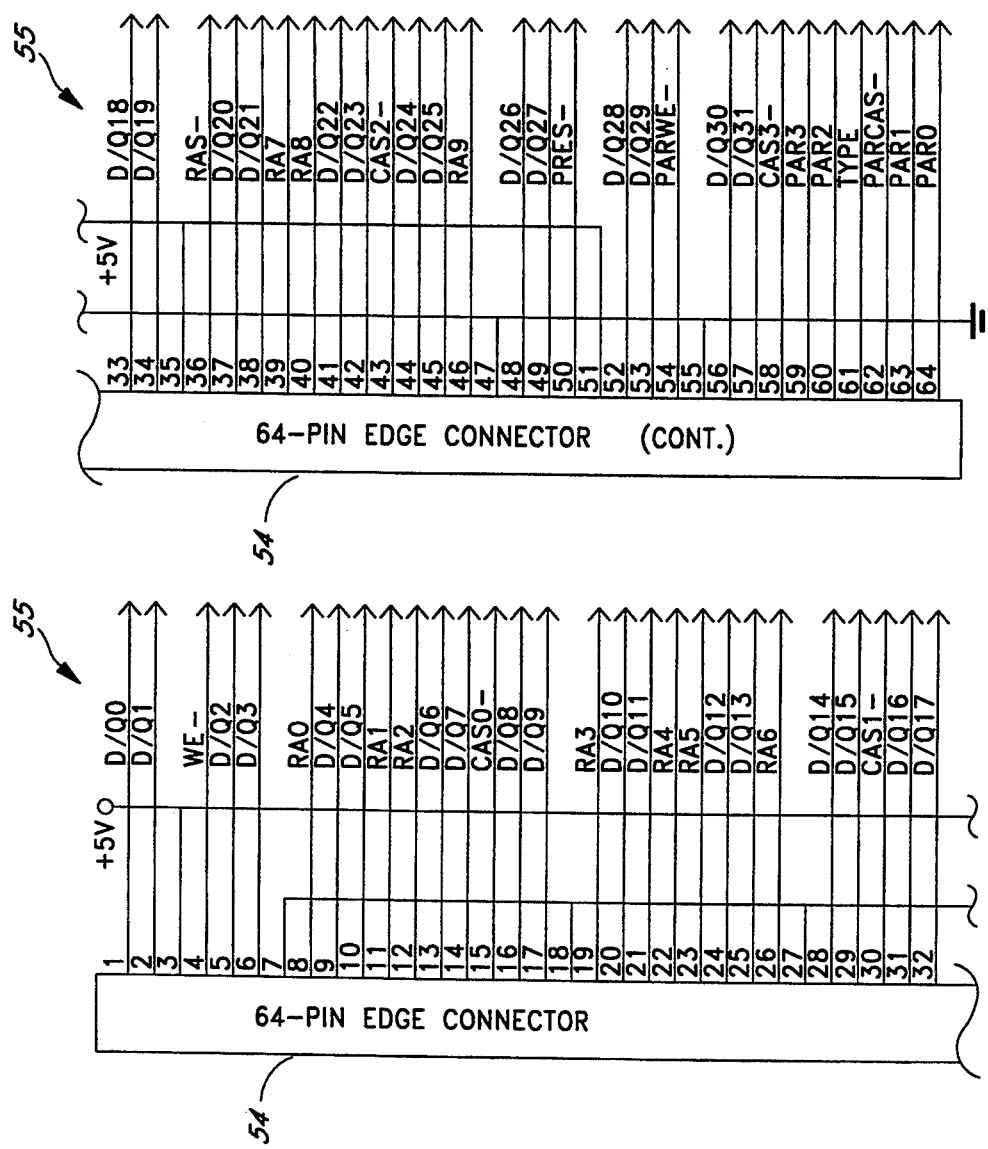
FIG. 3 is a schematic illustration of the preferred embodiment of the connection between a SIMM card and a PC motherboard.

FIG. 3 shows the output connections for a typical 4-Mbyte SIMM from the SIMM card 14 (FIG. 1) to the receiving socket 16 (FIG. 1) including all the power and ground lines that are necessary. As FIG. 3 illustrates, there are no spare pins available on the 64 pin-edge connector 54 on the circuit board 50 (FIGS. 4a–4c) to expand the capacity of the SIMM 14. In order to upgrade the existing SIMM from 4-Mbytes to 16-Mbytes, a new address line 32 (FIG. 2) is required, but there is no space for such a line. Therefore, in accordance with the present invention, one of the pins 55 of the 64 pin edge connector 54 on the circuit board 50 is shared to provide the new address line 32.

As illustrated in FIG. 4a–4c, each SIMM card 14 comprises a plurality of DRAM chips 30 which are soldered onto a printed circuit board 50. All of the address lines 32 that are required to address the DRAM chips 30 are routed from the pads 52, at the 64-pin edge 54 of the circuit board 50, to each of the DRAM chips 30. The appropriate address lines 32 are generated from the SIMM support circuitry 20 (FIG. 1) and are transferred to the SIMM card 14 through the appropriate pin of the receiving sockets 16 to the corresponding pad 52 on the 64-pin edge 54 of the printed circuit board 50. (All of the address lines 32 and their corresponding pads 52 are not detailed in FIGS. 4a–4c. Instead the specific pin connections can be determined by referring to FIG. 3.)

FIGS. 4a–4b illustrate the 1-Mbyte and 4-Mbyte SIMM cards 14 of the prior art. A capacity signal which indicates the capacity of these prior art SIMM cards 14 is transmitted by a type signal on a line 56 on the printed circuit board 50. As well known in the prior art, if the SIMM 14 has a 1-Mbyte capacity as in FIG. 4a, the type line 56 is tied to ground 58 on the printed circuit board 50. If the SIMM 14 is of a 4-Mbyte capacity as in FIG. 4b, then the type line 56 is not connected to ground on the printed circuit board 50. In the system of the present invention, the type line 56 is shared by the SIMM support circuitry 20 and is also used as an address line 32 for the 16-Mbyte SIMMs. As illustrated in FIG. 4c, the old type line 56 of FIGS. 4a–4b is now referred to as the RA10/TYPE line 60 in the system of the present invention and is still able to communicate with the 1-Mbyte and 4-Mbyte SIMM cards 14 of FIGS. 4a–4b.

Figure 5:
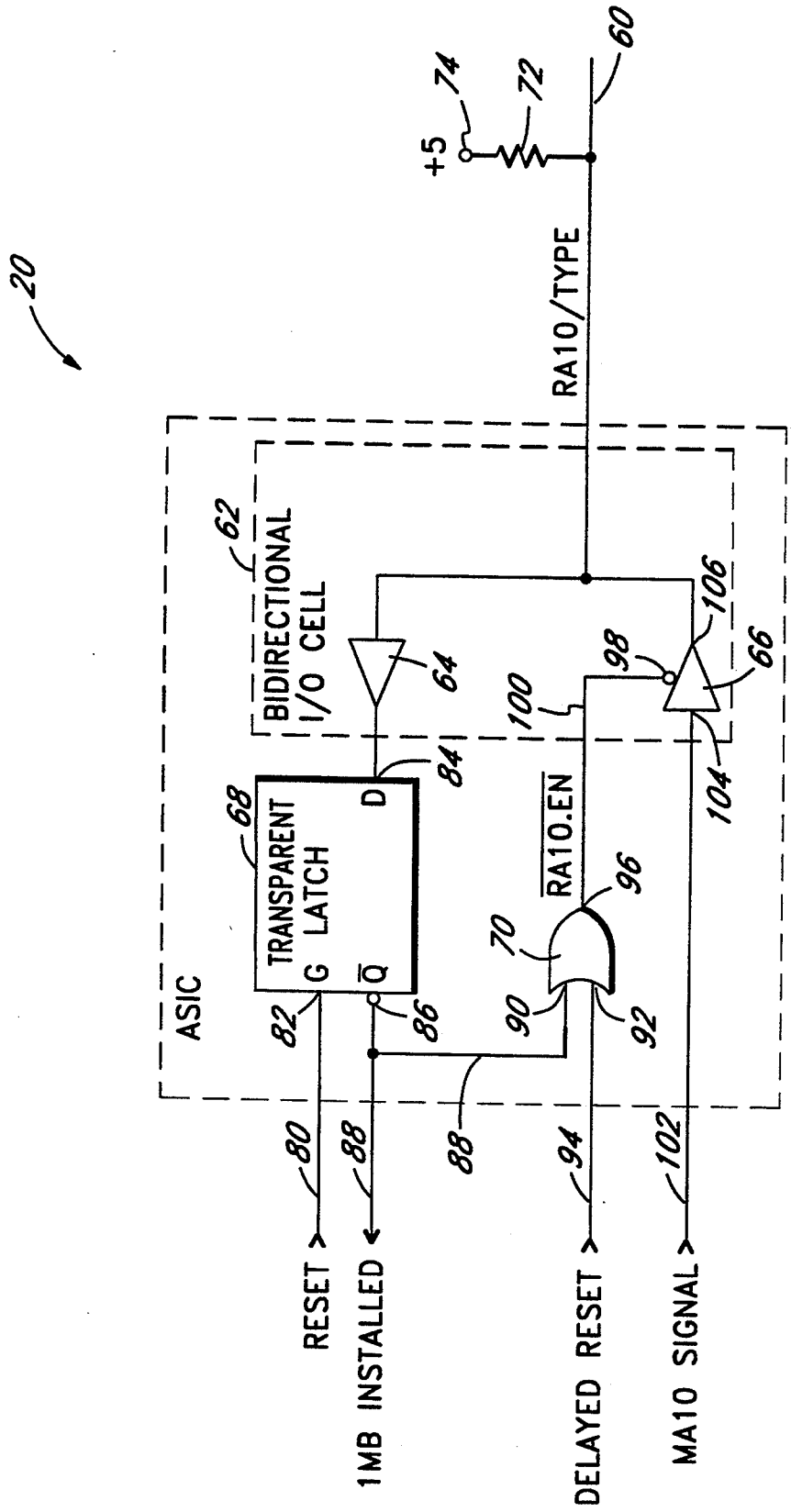
FIG. 5 is a schematic illustration of the preferred embodiment of the SIMM support circuitry of the present invention.

As illustrated in FIG. 5, the preferred embodiment of the SIMM support circuitry 20 comprises an ASIC formed of the following logic gates: a bi-directional I/O cell 62 comprising an input buffer 64, a tri-state output buffer 66, a transparent latch 68, and a transmission enable logic system preferably comprising a two-input OR-gate 70 and a pull-up resistor 72.

Figure 6:
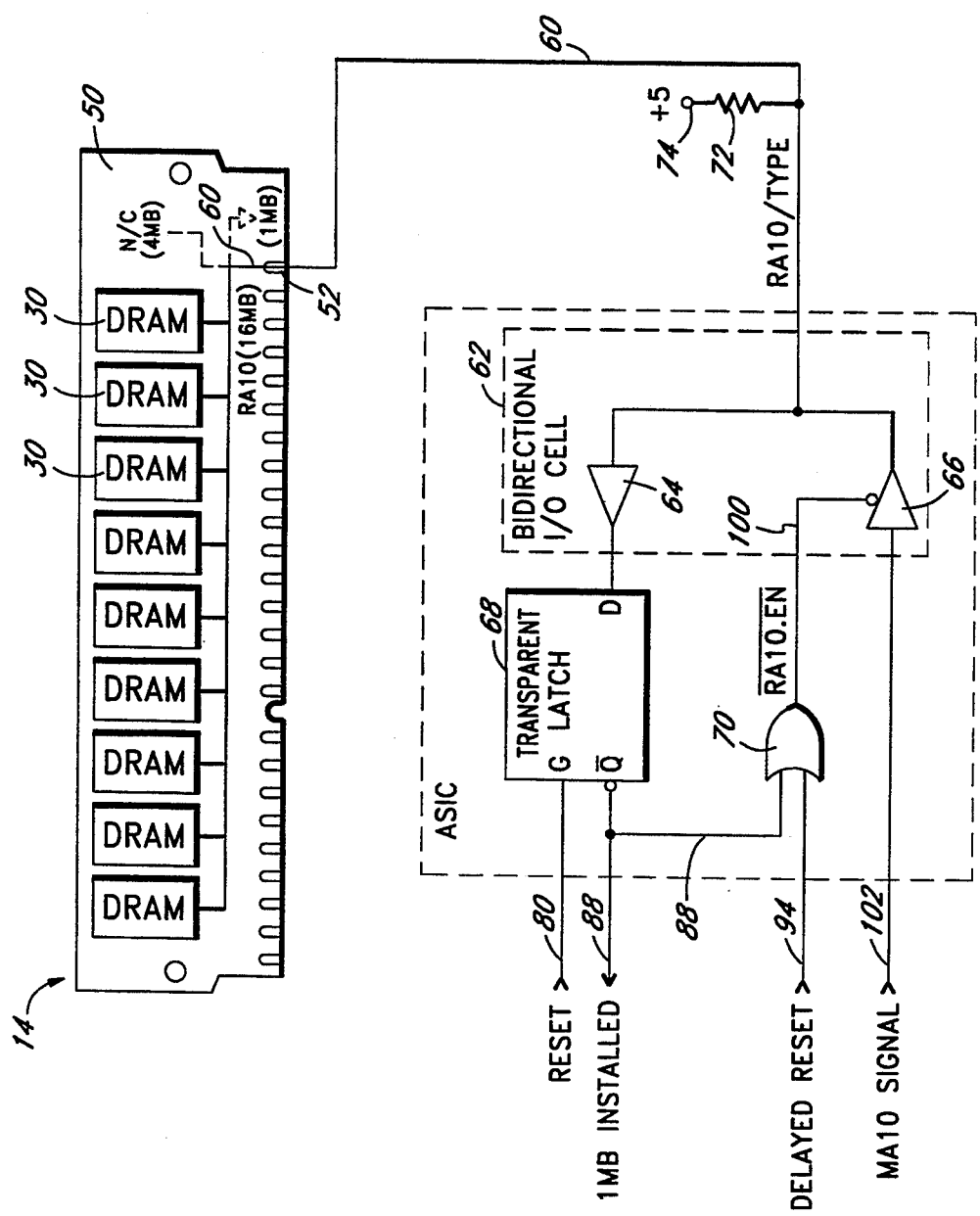
FIG. 6 is a schematic illustration of a SIMM card working in communication with the preferred embodiment of the SIMM support circuitry of the present invention.

FIG. 6 illustrates the connection of the preferred embodiment of the SIMM support circuitry 20, as illustrated in FIG. 5, with the SIMM card 14, as illustrated in FIGS. 4a–4c.

As illustrated in FIGS. 5 and 6, the RA10/TYPE line 60 is pulled up externally by the pull-up resistor 72 connected to +5 volts 74. The pull-up resistor 72 sends a high to the transparent latch 68 of the SIMM support circuitry 20 when the RA10/TYPE line 60 is not grounded by the installation of a 1-Mbyte SIMM or when it is being used to transmit address information. If the installed SIMM 14 is a 1-Mbyte SIMM, the pull-up resistor 72 cannot pull up the RA10/TYPE line 60 and the SIMM support circuitry 20 determines that a 1-Mbyte SIMM is installed. Otherwise, the pull-up resister 72 sends a high to the SIMM support circuitry 20. The SIMM support circuitry thus determines that either a 4-Mbyte or a 16-Mbyte SIMM is installed, and, during an addressing cycle, the pull-up resistor 72 allows the normal transmission of the address information on the RA10/TYPE line 60.

The operation of the preferred embodiment of the SIMM support circuitry 20, as illustrated in FIG. 5, is described below. At the trailing edge of a Hard Reset by the computer system, caused by a power-on or push-button reset condition, a RESET line 80 connected to the latch input 82, will toggle from high to low and will clock a gate input 84 of the transparent latch 68 of the SIMM support circuitry 20 to latch the signal from the RA10/TYPE line 60. The RA10/TYPE signal on the line 60 will appear at a complemented output 86 of the latch 68 in its inverted form as the signal line 1 MB INSTALLED on the line 88. The 1 MB INSTALLED signal on the line 88 is an active high signal. As described above, if the SIMM 14 is a 1-Mbyte SIMM, the RA10/TYPE signal line 60 will be a low and the 1 MB INSTALLED signal on the line 88 will be active (e.g., high). If the SIMM 14 is either a 4-Mbyte SIMM or a 16-Mbyte SIMM, the RA10/TYPE signal line 60 will be a high and the 1 MB INSTALLED signal on the line 88 will be inactive (e.g. low). The 1 MB INSTALLED signal line 88 transmits the capacity of the installed SIMM 14 to a plurality of locations on the motherboard 10.

The 1 MB INSTALLED signal line 88 is connected to one input 90 of a two input OR-gate 70. A second input 92 of the OR-gate 70 is connected to a DELAYED RESET signal line 94, which provides an active high signal to prevent a race condition from occurring. An output 96 of the two-input OR-gate 70 generates a $\overline{\text{RA10.EN}}$ signal on the line 100 which is connected to an enable input 98 of the output buffer/driver 66. The $\overline{\text{RA10.EN}}$ enable signal on the line 100 is active low and controls the transmission of an MA10 signal line 102 to the RA10/TYPE line 60. The DELAYED RESET signal on the line 94 will prevent a race condition from occurring by remaining high while the transparent latch 68 is reaching a steady-state condition and will block the buffer 66, which preferably acts as both a buffer and a driver, from transmitting data until the 1 MB INSTALLED signal on the line 88 has reached that steady-state condition. The DELAYED RESET signal on the line 94 also prevents damage to the output buffer 66 by preventing the buffer from driving the RA10/TYPE line 60 when RA10/TYPE line 60 is grounded. In addition, it reduces power consumption on the motherboard under the same conditions. When a 1-Mbyte SIMM is installed, the 1 MB INSTALLED signal on the line 88 is active. This will cause the $\overline{\text{RA10.EN}}$ signal on the line 100 to be inactive and it will block the MA10 signal on the line 102 from being transmitted through the buffer 66. If either a 4-Mbyte or a 16-Mbyte SIMM is installed, the 1 MBYTE INSTALLED signal on the line 88 will be inactive. When the DELAYED RESET signal on the line 90 transitions to a low, both inputs to the OR-gate 70 will be low. Therefore, the $\overline{\text{RA10.EN}}$ signal on the line 100 will be active and will enable the transmission of the MA10 signal from the line 102 through the buffer 66.

An input 104 of the transmission buffer 66 is connected to receive the normal MA10 signal on the line 102 which is used to address the additional locations of a 16-Mbyte SIMM. An output 106 of the buffer 66 is connected to the RA10/TYPE line 60. As illustrated in FIG. 6, if the SIMM 14 is a 16-Mbyte SIMM, the RA10/TYPE signal on the line 60 is connected to the uppermost address line of the DRAMs 30 on the SIMM 14. If the SIMM 14 is a 4-Mbyte SIMM, the RA10/TYPE line 60 is not connected to any gates on the printed circuit board 50 as the additional address line is not needed. If the SIMM 14 is a 1-Mbyte SIMM, the RA10/TYPE signal on the line 60 is always grounded.

The transmission buffer 66 is part of the I/O cell 62. The I/O cell 62 is used to protect the circuitry on the SIMM card 14 as well as on the motherboard 10. In the present invention, the MA10 signal on the line 102 is using the same pad 52 location which transmits the SIMM 14 capacity information on the RA10/TYPE line 60. If the MA10 signal on the line 102 was not buffered, and a 1-Mbyte SIMM was installed, the MA10 signal on the line 102 would be connected to ground 58 by the type signal on the line 60. If the system tried to drive the MA10 line 102 high while addressing other memory units, it could burn up the drivers of the MA10 signal 102 on the motherboard 10 as well as the transparent latch 68 of the SIMM support circuitry 20. Even if it did not damage the drivers, it would increase power consumption by continuing to drive the SIMM support circuitry 20.

If the 1-Mbyte SIMM is not installed and the RA10/TYPE signal on the line 60 is thus inactive, the system will determine if a 4-Mbyte or a 16-Mbyte SIMM is installed. During initialization, boot software within the computer system will determine the capacity of each SIMM 14 and then determine the proper addressing scheme for the main memory. First, the system will attempt to write information to the SIMM 14 and then read back the information. The system writes a unique data pattern for each block of addressable data starting from the lowest block of addressable data of the SIMM 14 and continues until it exhausts all of the possible addresses of the SIMM 14. The system will then read back each block of data and will stop when it begins to read back the same data it read previously. At this point the memory capacity has been exhaustively tested and the system is simply readdressing the same lower blocks of data. This phenomena is referred to as aliasing as the blocks of data exactly coincide in the lower address space when there are no additional upper blocks to access. When the system capacity has been exhaustively tested, there are no locations for the upper address lines to access, but the lower address lines continue to repeat themselves and will reaccess the lower blocks of data. If the system finds that the data is repeating after accessing all the addresses above 4-Mbytes, then the system determines that the addressing has wrapped around and that the SIMM 14 in the receiving socket 16 is a 4-Mbyte SIMM. If the system can access the data up to 16-Mbytes without aliasing, then the system determines that the SIMM 14 in the receiving socket 16 is a 16-Mbyte SIMM. Once the capacity of each of the installed SIMMs 14 has been determined, the computer system will be able to access the additional SIMM memory in the same manner it accesses the rest of the computer system's main RAM.

The SIMM support system is not only critical in determining the type of the SIMMs 14 that are installed in the receiving sockets 16 on the motherboard 10, but it is also used in communication with the hardware of the computer system to properly access the memory contained in the individual SIMMs 14.

Although the invention has been described with reference to specific embodiments, the description is intended to be illustrative of the invention and is not intended to be limiting. Various modifications and applications may occur to those skilled in the art without departing from the true spirit and scope of the invention as defined in the appended claims.

What is claimed is:

1. A support system for a computer system which enables a computer to recognize and address a plurality of circuit boards, each of said circuit boards installed in a receiving socket having a fixed number of pins, wherein a required number of signals transmitted between said support system and said circuit board and between said circuit board and said support system may be larger than can be transmitted by the fixed number of pins of said receiving socket, said support system comprising:

a single pin on said receiving socket shared by a first signal for conveying information from said circuit board to said support system and a second signal for conveying information from said support system to said circuit board, said first signal having one of first and second logic states;

a latch in said support system that stores the logic state of said first signal upon receiving an active reset signal from said computer system; and a transmission enable logic system in said support system that enables transmission of said second signal from said support system to said circuit board via said single pin when said reset signal is no longer active when said first signal is in said first logic state and that disables transmission of said second signal from said support system to said circuit board on said single pin when said first signal is in said second logic state.

2. A support system as defined in claim 1, further comprising:

an input buffer to isolate said first signal from the rest of said support system; and an output buffer to isolate the transmission of said second signal from the rest of said support circuitry.

3. A single inline memory module (SIMM) support system for a computer system which enables the computer system to recognize and address a SIMM having a storage capacity which may be larger than can be addressed by the number of pins provided on a receiving socket for said SIMM, comprising:

a shared signal line connected to a single pin of said receiving socket, said shared signal line being used to transmit both (1) a storage capacity signal for conveying an indication of the storage capacity of an installed SIMM from said SIMM to said support system, said storage capacity signal having a first logic state and a second logic, and (2) an address signal for conveying at least one bit of address information from said support system to said SIMM, said one bit of address information being needed to address the largest storage capacity SIMM that can be installed in said receiving socket;

a latch that stores the state of said storage capacity signal of the installed SIMM in response to a reset signal received from said computer system; and a transmission enable logic system that enables transmission of said at least one bit of address information on said shared line when the state of said storage capacity signal stored in said latch is said first logic state, said transmission enable logic system disabling transmission of said at least one bit of address information on said shared line when the state of said storage capacity signal stored in said latch is said second logic state.

4. A SIMM support system as defined in claim 3, wherein said transmission enable logic system comprises an output buffer to selectively isolate the transmission of said one bit of address information from the rest of the support system.

5. A SIMM support system as defined in claim 4, wherein said output buffer additionally comprises an output driver.

6. A SIMM support system as defined in claim 3, further comprising an input buffer to isolate the received storage capacity signal of the installed SIMM from the rest of the support system.

7. A SIMM support system as defined in claim 3, wherein said shared signal line is tied to a pull-up resister to cause said storage capacity signal to have a first logic low state when a 1-Mbyte SIMM has been installed and to have a second logic high state corresponding to said predetermined state when a 4-Mbyte or a 16-Mbyte SIMM has been installed.

8. A SIMM support system as defined in claim 3, further comprising an input buffer to isolate the received storage capacity signal of the installed SIMM from the rest of the support system, and wherein said transmission enable logic system comprises an output buffer to selectively isolate the transmission of said one bit of address information from the rest of the support system, said input buffer and said output buffer together comprising an input/output buffer cell.

9. A SIMM support system as defined in claim 3, wherein said transmission enable logic system comprises a two-input OR-gate.

10. A SIMM support system as defined in claim 3, wherein said transmission enable logic system enables said transmission of the uppermost SIMM address line after waiting a specified amount of time after a system reset, except when a 1-Mbyte SIMM is installed.

11. A single inline memory module (SIMM) support system for a computer system which enables the computer to recognize and address SIMMs of different storage capacity installed in a specifically sized receiving socket, comprising:

means for sharing a specific pin of said SIMM and a corresponding pin of said receiving socket for transmission of a signal indicating the storage capacity of an installed SIMM from said SIMM to said support system and for transmitting an address signal from said support system to said SIMM, said address signal being needed to address the SIMM of the largest storage capacity installed in said receiving socket;

means for receiving said storage capacity indicating signal of said installed SIMM, said storage capacity indicating signal having a first state indicating that said SIMM has a storage capacity greater than a minimum Storage capacity and having a second state indicating that said SIMM has said minimum storage capacity;

means for storing a stored logic level responsive to said storage capacity indicating signal upon receiving a reset signal from said computer system, said stored logic level being a first logic level when said storage capacity indicating signal has said first state, said stored logic level being a second logic level when said storage capacity indicating signal has said second state; and means for selectively transmitting said address signal via said shared SIMM pin and said corresponding pin of said receiving socket in response to said stored logic level, said transmitting means enabling the transmission of said address signal when said stored logic level has said first logic level, said transmitting means disabling the transmission of said address signal when said stored logic level has said second logic level.

* * * * *

UNITED STATES PATENT AND TRADEMARK OFFICE
CERTIFICATE OF CORRECTION

PATENT NO. : 5,357,624
DATED : October 18, 1994
INVENTOR(S) : Thomas J. Lavan

It is certified that error appears in the above-identified patent and that said Letters Patent is hereby corrected as shown below:

Column 8, line 9, change "second logic, and" to --second logic state, and--.

Signed and Sealed this

Twenty-third Day of December, 1997

Attest:

Attesting Officer

BRUCE LEHMAN

Commissioner of Patents and Trademarks